(12) United States Patent
Bywalez et al.

(10) Patent No.: US 12,451,861 B2
(45) Date of Patent: Oct. 21, 2025

(54) WAFER LEVEL PACKAGE

(71) Applicant: RF360 SINGAPORE PTE. LTD., Republic Plaza (SG)

(72) Inventors: Robert Felix Bywalez, Munich (DE); Karl Nicolaus, Zorneding (DE); Ilya Lukashov, Munich (DE); Luis Maier, Munich (DE)

(73) Assignee: RF360 Singapore Pte. Ltd., Republic Plaza (SG)

( * ) Notice: Subject to any disclaimer, the term of this patent is extended or adjusted under 35 U.S.C. 154(b) by 787 days.

(21) Appl. No.: 17/770,982

(22) PCT Filed: Oct. 30, 2020

(86) PCT No.: PCT/EP2020/080555
§ 371 (c)(1),
(2) Date: Apr. 21, 2022

(87) PCT Pub. No.: WO2021/089434
PCT Pub. Date: May 14, 2021

(65) Prior Publication Data
US 2025/0150054 A1  May 8, 2025

(30) Foreign Application Priority Data

Nov. 5, 2019 (DE) ..................... 10 2019 129 791.5

(51) Int. Cl.
*H03H 9/02* (2006.01)
(52) U.S. Cl.
CPC .... *H03H 9/02574* (2013.01); *H03H 9/02992* (2013.01)

(58) Field of Classification Search
CPC ....... H01L 2224/16145; H01L 2924/00; H01L 2224/0401; H01L 23/481; H01L 25/0657; H01L 25/50; H01L 21/76898; H01L 2224/02371; H01L 2224/05548; H01L 2224/13024; H01L 2224/9202; H01L 23/50; H01L 24/06; H01L 2924/00014; H01L 25/0652; H01L 2924/1461; H01L 21/76804; H01L 21/76877; H01L 2225/06513; H01L 2225/06531; H01L 2225/06534; H01L 2225/06551;
(Continued)

(56) References Cited

U.S. PATENT DOCUMENTS

2004/0161909 A1   8/2004   Meckes et al.
2017/0103957 A1   4/2017   Li et al.
(Continued)

FOREIGN PATENT DOCUMENTS

WO   2018005337   1/2018
WO   2018005351   1/2018

OTHER PUBLICATIONS

International Search Report and Written Opinion—PCT/EP2020/080555 —ISA/EPO—Jan. 21, 2021.

*Primary Examiner* — Lincoln D Donovan
*Assistant Examiner* — Tyler J Pereny
(74) *Attorney, Agent, or Firm* — Polsinelli

(57) ABSTRACT

A fullcover package solution in combination with copper pillars or solder bumps and acoustic cavities is proposed to provide maximum usable design area compared to current thin film acoustic wafer level packages. Manufacturing can be done in a self-aligned interconnection process.

10 Claims, 3 Drawing Sheets

Figure 1:
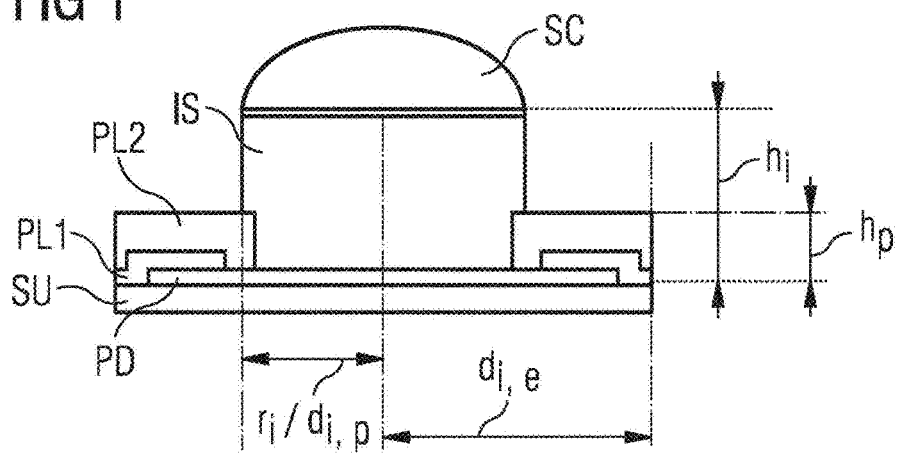

(58) Field of Classification Search
CPC .. H01L 23/5386; H10N 30/088; H10N 30/07;
H10N 30/50; H10N 30/708; H10N
70/011; H10N 70/061; H10N 70/066;
H10N 70/231; H10N 70/24; H10N
70/245; H10N 70/801; H10N 70/821;
H10N 70/826; H10N 70/8265; H10N
70/841; H10N 70/8833; H10N 70/8836
See application file for complete search history.

(56) References Cited

U.S. PATENT DOCUMENTS

| | | | |
|---|---|---|---|
| 2019/0229703 A1* | 7/2019 | Metzger | H03H 3/0072 |
| 2019/0238113 A1* | 8/2019 | Rosezin | H03H 9/1057 |

* cited by examiner

WAFER LEVEL PACKAGE

A wafer level package technology for device that require a cavity is called TFAP (Thin Film Acoustic Package). All package layers are deposited and structured sequentially one above the other with a safety distance originating from process errors, e.g. overlay, process bias deviation and other process fluctuations. These safety distances ensure that layers are properly enclosing or overlapping the layers below to ensure, e.g. the functionality of the final device. If more safety distances need to be considered for the packaging layers, more area on the chip is lost for functional structures.

First a sacrificial layer is produced and structured such that the structures of the sacrificial material remaining after structuring correspond to cavities formed later. After depositing a rigid cover layer (first package layer) the structures of the sacrificial material may be etched or dissolved through release holes of the first package layer. The first package layer forms a dome over each cavity. The release holes are then closed again and one or more re-enforcing layers are deposited on top.

Current wafer level packages suffer from a sub-optimal space usage by needing many safety distances that are due to various processes employed with interconnect and package manufacturing (to shield the acoustics from outer influences). These result in "exclusion" zones not available as active filter and interconnect areas.

It is an object of the present disclosure to provide a wafer level package that requires less space than currently used packages and that provides yet good protection of sensitive device structures.

A wafer level package comprises a substrate that has a top functional layer—that is a functional layer as a top layer. Electric device structures e.g. electrodes are realized in, on or under this functional layer. Pads connecting these device structures are arranged on the substrate and are connected to the device structures. A first package layer is applied on the top surface and defines cavities that remain between the substrate and the first package layer. The cavities are placed to enclose at least part of the device structures such that they are arranged therein.

A second package layer is applied over the entire surface of the first package layer and may cover a part of or the entire surface. Exposed from first and second package layer is a partial area of each pad. These exposed partial areas are functioning as contact areas. On each contact area an interconnect structure is formed and arranged extending up to a height over the surface higher than the height of the package layers.

This wafer level package may be used as a TFAP package that requires a minimum amount of substrate surface. The package can be formed integrally direct on the substrate. A further advantage is that interconnects made by interconnect structures can be placed individually on the surface according to requirements of the device structures that is where interconnects are needed and where pads can advantageously be placed on the surface of the substrate.

The wafer level package can also be formed on a die level. However, all package structures can be formed on wafer level.

The second package layer serves as a reinforcing part of the wafer level package. At the same time it can be used to define the contact areas. Interconnect structures can then be formed exclusively on the so-defined contact areas.

The first package layer is a dielectric layer and may be a rigid inorganic layer. It serves for forming domes under which cavities are enclosed. The second package layer may be a layer of a photosensitive polymer e.g. a photosensitive resist. Then, structuring of the second package layer can be performed by simply exposing the resist to a scanning light source or by exposing it to a light source with the help of a photo mask. After exposure the polymer layer is developed to remove undesired surface portions with a solvent or an etching method. If a positive tone photoresist is used only exposed areas are removed whereas if using a negative tone photoresist only unexposed areas can be removed during development process.

The first package layer may be formed of e.g. $SiO_2$ or SiN or any other suitable dielectric material.

The second package layer does not need not to fully cover the substrate surface and the underlying first package layer and may leave an uncovered margin along all edges of the substrate. However it is possible too that the second package layer fully covers the substrate surface and/or the underlying first package layer.

According to an embodiment some of the contact areas and the respective interconnect structures arranged thereon are laterally fully enclosed by the second package layer. That indicates, that the interconnect structures are situated in openings formed in the second package layer and the interconnects fully occupy these openings. Other contact areas can be arranged at the edge of the second package layer such that they are only partially surrounded by the second package layer. Further, at least some of the ladder ones may be arranged at the edge of the substrate.

As already mentioned openings or cutouts in a selected one of the first and second package layer may define the shape of the contact areas. The defining package layer can be chosen from first and second package layer and from an additional resist layer applied over second package layer. The openings may be formed in first and second package layer such that first and second package layer form flushing structural edges of the opening.

The optional additional resist layer is not a layer necessary for the package's tightness or resistance. However it may be referred to as a third package layer. Hence, the third package layer can be a relative thin layer when compared to the thickness of first and second package layer. Further, it needs to be an electrically isolating layer and may be a dielectric layer.

In case a third package layer is present the structural edges thereof may comply with the structural edges of the second package layer According to an embodiment the device structures are acoustic resonators that are packaged inside a cavity as they are sensitive to any mechanical impact and need to vibrate undisturbed.

The interconnect structures may comprise Cu pillars. However, other materials are possible too and the interconnect structure may be realized e.g. as a solder bump. In any case the interconnect structure extends in height over all other package layer to allow them to bond to a plane surface of another substrate or a PCB for example. For the purpose of bonding the top of the Cu pillar may be coated with a solder cap of a solder layer.

The second package layer may have a planar surface extending substantially parallel to the surface of the substrate and may comprise a polymer that can easily be applied in a planarizing manner e.g. as a low-viscosity polymer that can be applied in liquid form.

However planarizing of the second package layer can be done by a kind of a lamination process under application of mechanical pressure and/or heat or by fly-cutting. By way of a lamination process the second package layer can be softened, deformed and planarized.

The interconnect structures may be located at arbitrary locations on the substrate. Most of all of the interconnect structures may be surrounded by the second package layer. However, according to an example, at least some of the interconnect structures are situated as close as possible to the substrate edge without any other layers in between.

According to an embodiment first and second package layer as well as the optional additional resist layer on top of the second package layer have coincident structure edges. The complete surface of the first package layer is covered by the second package layer and/or the additional resist layer. However, the second package layer may be structured such that it overlays some or all structural edges of the first package layer.

A safety distance may be kept between a structure edges of the first package layer and the interconnect structures. However, little or no safety margin need to be kept between second package layer and interconnect structures.

In the following the wafer level package will be explained in more detail with reference to specific embodiments and the accompanied figures. The figures are schematic only and may not show all elements as far as these omitted elements are known in the art and can easily be complemented by a skilled worker. Moreover the figures are not drawn to scale and some details may be depicted enlarged for clarity reason and better understanding.

Figure 2:
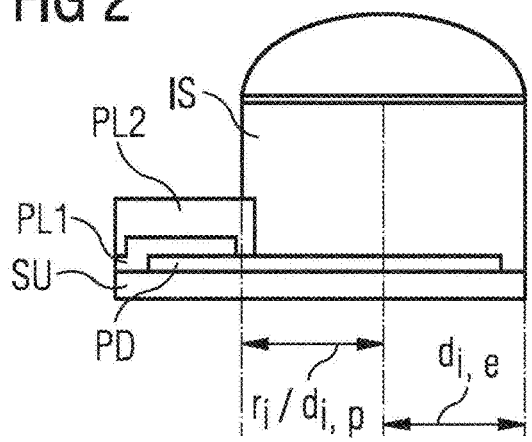
Figure 3:
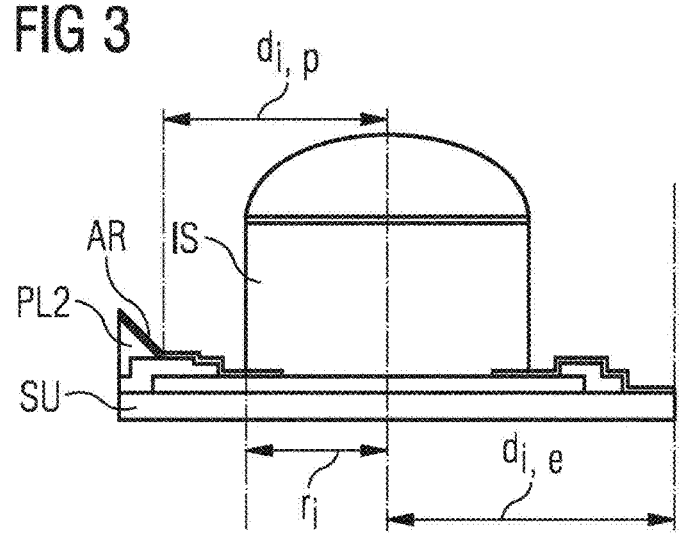
Figure 4:
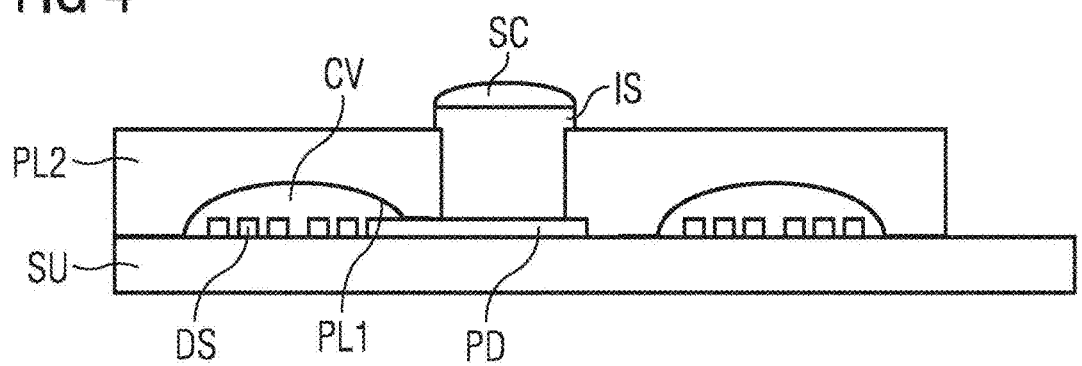
Figure 5:
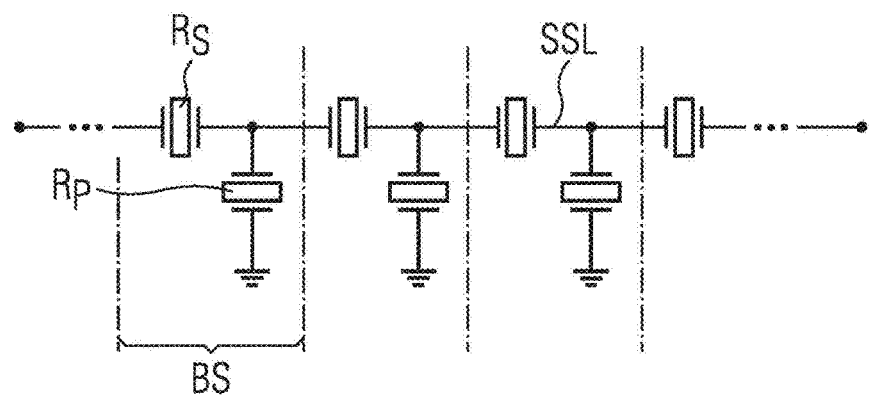
Figure 6:
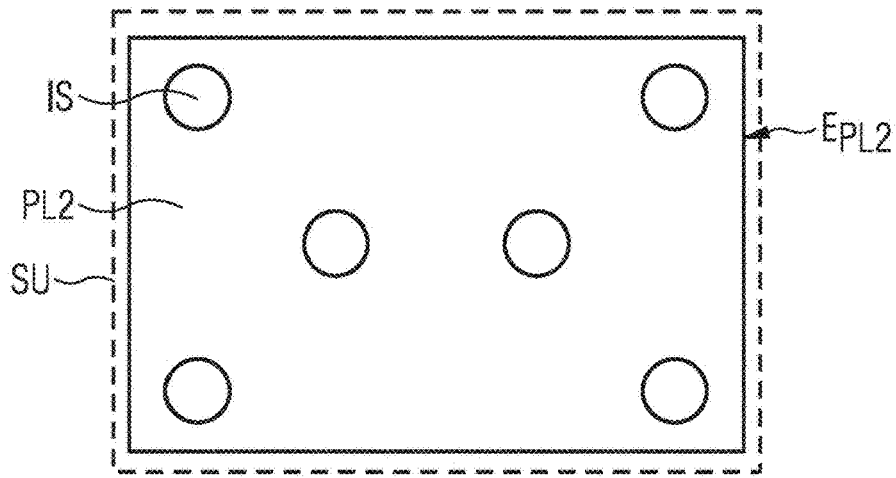
Figure 7:
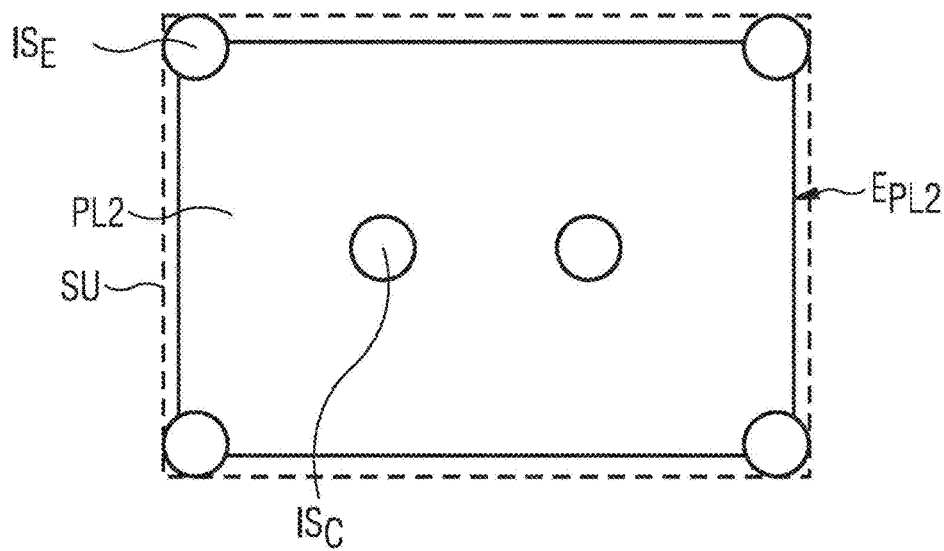
Figure 8:
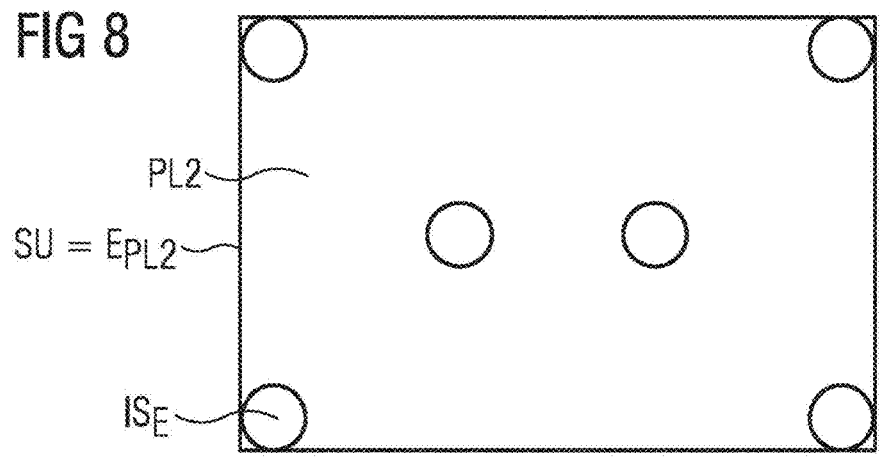

FIG. 1 shows a wafer level package according to a first embodiment in a schematic cross section FIG. 2 shows a wafer level package according to a second embodiment in a schematic cross section FIG. 3 shows a wafer level package according to a third embodiment in a schematic cross section FIG. 4 shows a larger depiction of a wafer level package in a schematic cross section FIG. 5 shows a schematic block diagram of a filter device that may be encapsulated by the new wafer level package FIG. 6 shows a schematic sectional top view onto the new wafer level package FIG. 7 shows a schematic top view onto a variant of the new wafer level package FIG. 8 shows a schematic top view onto another variant of the new wafer level package.

FIG. 1 shows a wafer level package according to a first embodiment in a schematic cross section. The package is depicted partially only and generally shows the area around the interconnect structure. In the following the process of manufacturing is explained.

The package is formed on a substrate SU that includes a functional material or has at least a functional layer as a top layer. The functional layer comprises a material that is functional for the electric device formed therein or thereon. The functional material is e.g. a piezoelectric material and the device is a micro acoustic device, e.g. a SAW filter or a BAW device. The filter device is formed by applying device structures DS (as shown in FIG. 4) on the top surface of the substrate or to the functional layer. The device structures of a SAW device comprise interdigital transducers, reflectors and pads PD for electrically contacting the device. The device structures of a BAW device comprise top and bottom electrodes applied under the functional layer. Only a pad connected to the device structures is shown in this figure.

Acoustically active device structures (not shown in this figure) are generally mechanically and may be also hermetically protected by a package. A first package layer PL1 applied above the device structures forms domes over mechanically sensitive device structures that are in the example acoustically active device structures. For this purpose the first package layer of e.g. a dielectric is sufficiently rigid to freely span over the device structures in a distance forming a dome and keeping enclosed thereunder a cavity. $SiO_2$ or SiN are exemplary useful materials. The thickness of the first package layer is chosen to provide sufficient stability for the dome and depends on the diameter of the enclosed cavity. The cavities may be pre-formed in the first package layer or may be produced by way of a structure of sacrificial material that has to be removed after deposition of the package layer(s).

However other electric devices like MEMS devices or sensors may be packaged by way of the proposed wafer level package.

After being applied to the entire surface the first package layer is structured such that it rests on and seals to the substrate at least around the circumference of the domes. Further, after structuring the first package layer the contact areas of the pads PD are exposed.

In the next step a second package layer PL2 is deposited, e.g. in a planar manner, on the entire surface on the first package layer PL1. In a variant it is possible to leave a margin at the edge of the substrate uncovered. A polymer may be a photosensitive polymer like a photoresist is useful as the second package layer PL2 that is required for reinforcing the first package layer PL1. The polymer may be applied as a foil or in liquid or viscous form. The top surface may be already planar after deposition and no pressure is necessary for planarization.

In the next step the second package layer PL2 is structured by removing the layer where underlying structures need to be exposed. In the depicted embodiment the structural edges of the second package layer overlay the respective edges of the first package layer at the edge to the pad PD. At the outer edge towards the edge of the substrate SU structural edges of first and second package layer may comply. Here in the depicted example the second package layer covers a larger area than the first package layer.

In the region of the pad PD, the contact area exposed from both package layers is here completely defined by the surrounding edges of the second package layer PL2.

Then interconnect structures IS are formed in the next step selectively on the exposed contact areas. A selective metal deposition can be performed galvanically or currentless in a chemical metal deposition bath. A material may be Cu. However, forming interconnects from a solder is possible too.

The interconnect structures IS are grown up to a height $h_i$ that is higher than the combined height $h_p$ of the two package layers PL1, PL2. Then it is possible to easily mount the package as a whole to a PCB for example by way of the interconnect structures IS.

In case that the interconnect structure is a copper pillar a solder cap SC is applied on top thereof. An intermediate layer of e.g. Ni may be arranged between solder cap and Cu pillar.

Due to the full die coverage some of the safety distances do not need to be considered for spacing. An used exemplary distance employs a ratio of interconnect radius $r_i$ to package distance $d_{ip}$ of 1.4. In the dicing street region the ratio of the radius of the interconnect structures IS and the distance between the center of the interconnect structure IS to the outermost layer edge at the dicing street is currently around 2 to 3. With the proposed wafer level package both ratios can be reduced to one.

The full active die area is covered by the polymer of the second package layer PL2. Within this area the interconnects can be placed freely.

The possibility to fully enclose interconnects allows a placement of interconnects much closer to the sensitive active structures e.g. to resonators of a filter circuit. Thermal management is improved as well as the electrical performance of the device in the package. Moreover the embedding under the two package layers enhances the mechanical stability of the final device that is a die after dicing the large area package that is usually formed on a substrate wafer.

FIG. 2 shows a feature of a wafer level package according to a second embodiment in a schematic cross section.

Similar to the embodiment shown in FIG. 1 the interconnect structure IS is formed here by defining a contact area on the pad PD by means of structural edges of the second package layer PL2. However, at pads arranged near the outer edge of the substrate the structural edges of the second package layer do not fully surround the later contact area. On the remaining circumference uncovered edges of the pad are terminating the contact area. Hence, the interconnect structure IS is not fully surrounded and bounded by the first or second package layer. Here, the ratio of the radius of the interconnect structure IS and the distance between the center of the interconnect structure IS to the outermost layer edge at the dicing street is just one and hence, minimized.

When depositing or growing the interconnect structure IS, this structure may grow over the exposed outer edge of the pad PD which is the right edge in FIG. 2.

In a wafer level package different interconnects may be present at the same time. Where pads are located near the center of the package, these pads are interconnected by interconnect structures according to first embodiment shown in FIG. 1. Pads that are located near the edge of the substrate or near a later dicing street are interconnected by interconnect structures according to second embodiment shown in FIG. 2. FIG. 2 shows the second package layer overlapping the edge of the first package layer at the left edge of the pad PD. However it is possible that the edges of both package layers comply with each other.

FIG. 3 shows how the contact areas and interconnects have been formed according to the art. Here, exclusively an additional package layer AR has been applied over the second package layer PL2 to reinforce same and to define the contact area. When doing this, overlay errors and process deviations for each layer forming step have to be taken into account that high tolerances are required that enlarge the substrate area required.

In the cross section of FIG. 3 two different edges of the contact area are shown. On the right side an edge of the first package layer PL1 lays on the pad. Here, the additional package layer AR is applied on a section of the first package layer PL1 further confining the contact area that is smaller in area than the pad. On the left side of the figure the contact area is bounded similarly by an edge of the first package layer and an overlaying section of the additional package layer. A section of the second package layer PL2 is shown to be situated between first package layer and additional package layer but not direct at the boundary of the contact area. On the right side the shown edge of the substrate complies with the dicing street along which dies with single electric devices are singulated.

FIG. 4 shows a greater cross section of the wafer level package including the cavities CV under the first package layer PL1 in which the device structures DS are arranged. The depicted interconnect structure IS is formed according to the first embodiment shown in FIG. 1 for example.

The first package layer PL1 is relatively thin compared to the second package layer PL2 that reinforces the package and further provides a planar surface. The structural edges of first or second package layer may serve to bound the contact area and to define the area of the interconnect structure. The ladder is formed as a copper pillar and its top is covered with a solder cap SC.

FIG. 5 shows a block diagram of an exemplary filter circuit that may be packaged with the proposed package. This filter circuit comprises a number of e.g. four series resonators RS arranged in a series signal line SSL between an input and an output terminal. Respective nodes between each two neighbored series resonators are connected to ground via a parallel branches in which a parallel resonator RP or another impedance element may be arranged. An inductance (not shown) may be circuited between a parallel resonator and ground. A pair of a series resonator RS and a parallel resonator RP or impedance element form together a basic section BS of the filter circuit. Further series elements chosen from an inductance, a capacitance or another passive element may be present too. A filter circuit may have more or less basic sections dependent on the desired selectivity of the filter. More basic section can be used to further tune the filter functionality.

The resonators may be embodied as SAW resonators. However, also BAW and GBAW resonators can be packaged with the proposed package.

FIG. 6 is a schematic sectional top view onto the new wafer level package to show the extension of the package layer PL on the substrate SU. As can be seen the interconnect structures IS may be arbitrarily placed on the chip/substrate SU just where an active device structures needs to be contacted, for example along the edges. All interconnect structures are defined by respective cutouts in the second package layer PL2 such that each cutout is completely surrounded by remaining areas of package layer. These interconnects correspond to that shown in FIG. 1 for example. Here the second package layer PL2 does not fully cover the substrate SU but leaves a margin thereof exposed.

FIG. 7 is a similar schematic sectional top view onto the new wafer level package. Here two different locations of interconnect structures are existing in parallel. Centered interconnections $IS_C$ are embodied as shown in FIG. 6. Further interconnect structures $IS_E$ are situated directly on the edge of a package layer such that the edge intersects the contact area and interconnects formed thereon. This embodiment has the advantage that interconnects can be placed nearer to the edge of substrate SU or die and saves space on the die.

In both cases as shown in FIGS. 6 and 7 the edges of the package layers $E_{PL}$ do not extend to the edge of the die or substrate SU but keep a safety margin of the substrate uncovered.

FIG. 8 is similar to FIG. 7 with the only difference that the second package layer PL fully covers the substrate SU. Hence, edge $E_{PL2}$ complies with the edge of the substrate. As no margin is left surface area can be saved on the substrate without violating safety requirements for achieving a high yield and reliable components.

The invention has been explained with regard to some embodiments and figures but may not be restricted to the exact combination of features according to the embodiments. Any feature that has been described to provide advantage to the wafer level package shall be regarded to be independent from companying other features that are depicted on a common figure or described together in the same embodiment.

LIST OF USED TERMS AND REFERENCE SYMBOLS

| | |
|---|---|
| AR | additional resist package layer |
| BS | Basic section of a ladder type filter circuit |
| CA | contact area formed from a partial area of each pad |
| CV | cavity |
| $d_{ie}$ | distance between center of interconnect and edge of substrate |
| $d_{ip}$ | Distance between center of interconnect and package layer edge |
| DS | electric device structures |
| FL | functional layer |
| $h_i$ | height of interconnect structure over substrate |
| $h_p$ | height of package layers over substrate |
| IS | interconnect structure |
| PL1 | first package layer |
| PL2 | second package layer |
| $r_i$ | Radius of interconnect |
| RF | Parallel resonator |
| RS | Series resonator |
| SSL | Series signal line |
| SU | substrate |

The invention claimed is:

1. A wafer level package, comprising:
a substrate (SU) having a functional layer and electric device structures (DS) realized in the functional layer, on the functional layer or under the functional layer;
a first package layer (PL1) applied on the substrate, the first package layer defining cavities (CV) between the substrate and the first package layer, at least part of the device structures being arranged in the cavities;
a second package layer (PL2) applied over a surface of the first package layer;
pads (PD) arranged on the substrate and connected to the device structures, a partial area of each pad forming a respective contact area that is not covered by the first package layer or the second package layer;
an interconnect structure (IS) deposited on each respective contact area and extending up to an interconnect height ($h_i$) over the substrate, the interconnect height being higher than a package height ($h_p$) of the first package layer and the second package layer over the substrate; and
solder caps (SC) disposed at a respective distal end of each respective interconnect structure.

2. The wafer level package of claim 1, wherein the first package layer is a rigid inorganic layer and wherein the second package layer is a polymer layer.

3. The wafer level package of claim 1,
wherein a margin along at least one edge of the substrate excludes the second package layer, wherein at least some of the respective contact areas and the corresponding interconnection structures are fully enclosed by the second package layer, and wherein other contact areas are optionally situated at an edge (EPL2) of the second package layer such that the other contact areas are only partially surrounded by the second package layer.

4. The wafer level package of claim 1, wherein cutouts in a selected package layer defines shapes of the respective contact areas, and wherein the selected package layer is chosen from first package layer, the second package layer or an additional resist layer (AR) that is optionally applied over the second package layer.

5. The wafer level package of claim 1, wherein the first package layer is formed of $SiO_2$ or SiN.

6. The wafer level package of claim 1, wherein the device structures are acoustic resonators (R) and wherein the interconnect structures comprise copper (Cu) pillars or solder bumps.

7. The wafer level package of claim 1,
wherein the second package layer has a planar surface parallel to a substrate surface and comprises a photosensitive resist.

8. The wafer level package of claim 1, wherein the interconnect structure and the substrate have a common edge vertical to the surface of the substrate.

9. The wafer level package of claim 1, wherein the first package layer, the second package layer, and an optional additional dielectric layer on top of the second package layer have non-coincident structure edges, and wherein a complete surface of the first package layer is covered by one or more of the second package layer or the additional dielectric layer.

10. The wafer level package of claim 1, wherein a plurality of gaps are disposed between structure edges of the first package layer and respective circumferences of any interconnect structure surrounded by corresponding structure edges of the first package layer.

* * * * *